(12) United States Patent
Mao et al.

(10) Patent No.: US 12,185,608 B2
(45) Date of Patent: Dec. 31, 2024

(54) LIGHT EMITTING DEVICE

(71) Applicant: Innolux Corporation, Miao-Li County (TW)

(72) Inventors: Li-Wei Mao, Miao-Li County (TW); Ker-Yih Kao, Miao-Li County (TW); Ming-Chia Shih, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 88 days.

(21) Appl. No.: 17/581,996

(22) Filed: Jan. 24, 2022

(65) Prior Publication Data

US 2022/0238611 A1    Jul. 28, 2022

Related U.S. Application Data

(60) Provisional application No. 63/142,501, filed on Jan. 28, 2021.

(30) Foreign Application Priority Data

Dec. 16, 2021   (CN) .......................... 202111547564.3

(51) Int. Cl.
*H10K 59/35*     (2023.01)
*G02F 1/1335*    (2006.01)
*G02F 1/1343*    (2006.01)
*H10K 59/122*    (2023.01)

(52) U.S. Cl.
CPC ..... *H10K 59/353* (2023.02); *G02F 1/133514* (2013.01); *G02F 1/134345* (2021.01); *H10K 59/122* (2023.02); *G09G 2300/0452* (2013.01)

(58) Field of Classification Search
CPC ............... H10K 59/353; H10K 59/122; G02F 1/134345; G09G 2300/0452
USPC .................................... 349/61–68, 142–147
See application file for complete search history.

(56) References Cited

U.S. PATENT DOCUMENTS

| | | | |
|---|---|---|---|
| 11,411,064 B2 * | 8/2022 | Lee | A61B 5/316 |
| 2019/0355795 A1 * | 11/2019 | Liu | G09G 3/3225 |
| 2020/0020676 A1 * | 1/2020 | Cok | H10K 59/131 |
| 2020/0258869 A1 * | 8/2020 | Wu | H01L 33/60 |
| 2021/0091145 A1 | 3/2021 | Huangfu et al. | |
| 2021/0359029 A1 * | 11/2021 | Feng | G09G 3/3208 |
| 2021/0399062 A1 * | 12/2021 | Han | H10K 59/122 |
| 2022/0180808 A1 * | 6/2022 | Richter | G09G 3/006 |
| 2022/0380891 A1 * | 12/2022 | Cope | G09G 3/2088 |

FOREIGN PATENT DOCUMENTS

| | | |
|---|---|---|
| CN | 111684512 | 9/2020 |
| TW | 202125848 | 7/2021 |

OTHER PUBLICATIONS

"Office Action of Taiwan Counterpart Application", issued on Dec. 2, 2022, p. 1-p. 7.

* cited by examiner

*Primary Examiner* — Charles S Chang
(74) *Attorney, Agent, or Firm* — JCIPRNET

(57) ABSTRACT

The disclosure provides a light emitting device including a substrate and multiple pixels. The pixels are disposed on the substrate, each of the pixels includes multiple sub-pixels. Two adjacent sub-pixels are separated by a distance D, and one of the two adjacent sub-pixels has a height H. The distance and the height satisfy a relational expression: $0.3H < D \leq 30H$.

11 Claims, 5 Drawing Sheets

LIGHT EMITTING DEVICE

CROSS-REFERENCE TO RELATED APPLICATION

This application claims the priority benefits of U.S. provisional application Ser. No. 63/142,501, filed on Jan. 28, 2021, and China application serial no. 202111547564.3, filed on Dec. 16, 2021. The entirety of each of the above-mentioned patent applications is hereby incorporated by reference herein and made a part of this specification.

BACKGROUND

Technical Field

The disclosure relates to a light emitting device.

Description of Related Art

Multiple sub-pixels are disposed in a light emitting device to provide required light emitting performance or present pictures. The arrangement of the sub-pixels often affects the light emitting performance and thus becomes a highly important part in designing light emitting devices.

SUMMARY

An embodiment of the disclosure provides a light emitting device including a substrate and multiple pixels. The pixels are disposed on the substrate, and each of the pixels includes multiple sub-pixels. Two adjacent sub-pixels are separated by a distance D, and one of the two adjacent sub-pixels has a height H. The distance and the height satisfy a relational expression: $0.3H<D \leq 30H$.

Embodiments accompanied with drawings are described in detail below to make the aforementioned features and advantages of the disclosure comprehensible.

BRIEF DESCRIPTION OF THE DRAWINGS

The accompanying drawings are included to provide a further understanding of the embodiment, and are incorporated in and constitute a part of this specification. The drawings illustrate the embodiments of the disclosure, and together with the description are used to explain the principles of the disclosure.

DESCRIPTION OF THE EMBODIMENTS

Figure 1:
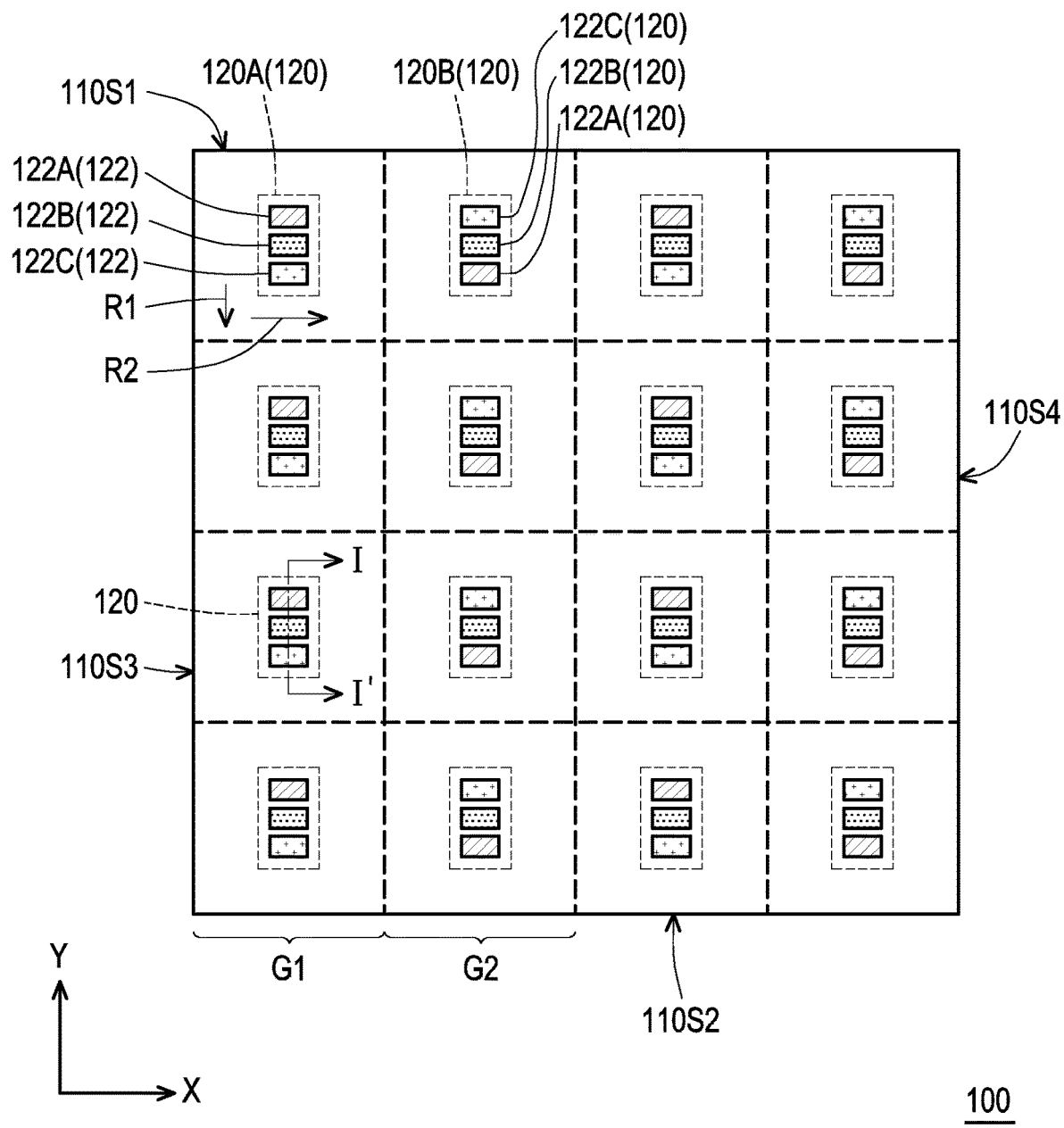
FIG. 1 is a schematic diagram of a light emitting device according to an embodiment of the disclosure.

The disclosure may be understood by referring to the following detailed description in conjunction with the accompanying drawings. It should be noted that, in order to facilitate understanding and for concision of the drawings, only a part of an electronic device is shown in multiple drawings in the disclosure, and certain components in the drawings are not drawn to actual scale. In addition, the number and size of each component in the drawings are only exemplary and are not used to limit the scope of the disclosure.

Certain words will be used to refer to specific components throughout the specification and the appended claims of the disclosure. People skilled in the art should understand that electronic apparatus manufacturers may refer to same components under different names. The disclosure does not intend to distinguish between components having same functions but different names. In the following specification and claims, the words "comprising," "having," and "including" are open-ended words and thus should be interpreted as "including but not limited to." Therefore, the terms "comprising," "having," and/or "including," when used in the description of the disclosure, specify the existence of corresponding features, regions, steps, operations, and/or members but do not exclude the existence of one or more corresponding features, regions, steps, operations, and/or members.

Wordings used herein to indicate directions, such as "up," "down," "front," "back," "left," and "right," merely refer to directions in the accompanying drawings. Therefore, the directional wordings are used to illustrate rather than limit the disclosure. In the accompanying drawings, the drawings illustrate the general features of the methods, structures, and/or materials used in the particular exemplary embodiments. However, the drawings shall not be interpreted as defining or limiting the scope or nature covered by the exemplary embodiments. For example, the relative size, thickness, and location of layers, regions, or structures may be reduced or enlarged for clarity.

When a corresponding member (such as a layer or a region) is described as being "disposed or formed on another member," it may be directly disposed or formed on another member, or there may be other member therebetween. On the other hand, when a member is described as being "directly disposed or formed on another member," no member exists therebetween. In addition, when a member is described as being "disposed or formed on another member," the two have a vertical relationship in the top view direction, and this member may be located above or below the other member, and the vertical relationship depends on the device orientation.

It should be understood that when a member or a layer is described as being "connected to" another member or layer, it may be directly connected to this member or layer, or there may be an intervening member or layer therebetween. When a member is described as being "directly connected to" another member or film layer, no intervening member or layer exists therebetween. In addition, when a member is described as being "coupled to another member (or a variant thereof)," it may be directly connected to this member, or be indirectly connected (such as being electrically connected) to this member through one or more members.

Ordinal numbers in this specification and the claims such as "first" and "second" are used to modify a component, and do not imply or represent that the (or these) component(s) has (or have) any ordinal number, and do not indicate any order between a component and another component, or an order in a manufacturing method. These ordinal numbers are merely used to clearly distinguish a component having a name with another component having the same name. Different terms may be used in the claims and the specification, so that a first member in the specification may be a second member in the claims.

The terms "about," "approximately," "substantially," and "roughly" referred to herein generally mean within a range of 10% of a given value, or mean within a range of 5%, 3%, 2%, 1%, or 0.5% of a given value. The given value herein is an approximate value, meaning that "about," "approximately," "substantially," and "roughly" may be still implied without a specific description of "about," "approximately," "substantially," and "roughly." In addition, the phrases "a range from a first value to a second value" and "a range between a first value to a second value" indicate the range includes the first value, the second value, and other values therebetween.

The electrical connections or couplings described in the disclosure may all refer to direct connections or indirect connections. In the case of the direct connection, terminals of components on two circuits are directly connected or connected through a conductive line, and in the case of the indirect connection, between the terminals of the components on the two circuits are a switch, a diode, a capacitor, an inductor, a resistor, other suitable components, or a combination of the above components, but the disclosure is not limited thereto.

In the disclosure, the thickness, length, and width may be measured with an optical microscope, and the thickness or width may be measured with a cross-sectional image in an electron microscope, but the disclosure is not limited thereto. In addition, any two values or directions used for comparison may have a certain error.

It should be understood that the following embodiments may disassemble, replace, reorganize, and mix the features in several different embodiments to complete other embodiments without departing from the spirit of the disclosure. As long as the features of the embodiments do not violate the spirit of the disclosure or conflict each other, they may be mixed and matched as desired.

FIG. 1 is a schematic diagram of a light emitting device according to an embodiment of the disclosure. A light emitting device 100 in FIG. 1 includes a substrate 110 and multiple pixels 120. The substrate 110 may have a circuit (not illustrated), and these pixels 120 are, for example, arranged into an array along an X axis and a Y axis on the substrate 110, but the disclosure is not limited thereto. A pixel 120 may include multiple sub-pixels 122. In some embodiments, a sub-pixel 122 includes a light emitting component, such as a light emitting diode. The light emitting diode may include, for example but not limited to, an organic light emitting diode (OLED), a mini light emitting diode (mini LED), a micro light emitting diode (micro LED), or a quantum dot (QD) light emitting diode (QLED or QDLED), fluorescence, phosphors, or other suitable materials, and a combination thereof. In some embodiments, the light emitting component may be a light emitting chip, and the sub-pixels 122 may be coupled to the substrate 110 in a chip-on-board (COB) form, which means light emitting chips as the sub-pixels 122 may be electrically connected to the circuit on the substrate 110. In some embodiments, a sub-pixel 122 may include a light emitting chip as the light emitting component and a package material for encapsulating the light emitting chip, and a sub-pixel 122 may be coupled to the substrate 110 in a package-on-board (POB) form. In some embodiments, multiple sub-pixels 122 of one single pixel 120 may be encapsulated in the same package structure by the package material and may be coupled to the substrate 110 in the POB form. In addition, although a pixel 120 in this embodiment includes three sub-pixels 122 for exemplification, the disclosure is not limited thereto. In other embodiments, the amount of the sub-pixels 122 that a pixel 120 may have is 2, 3, 4, 5, or other numbers.

Figure 2:
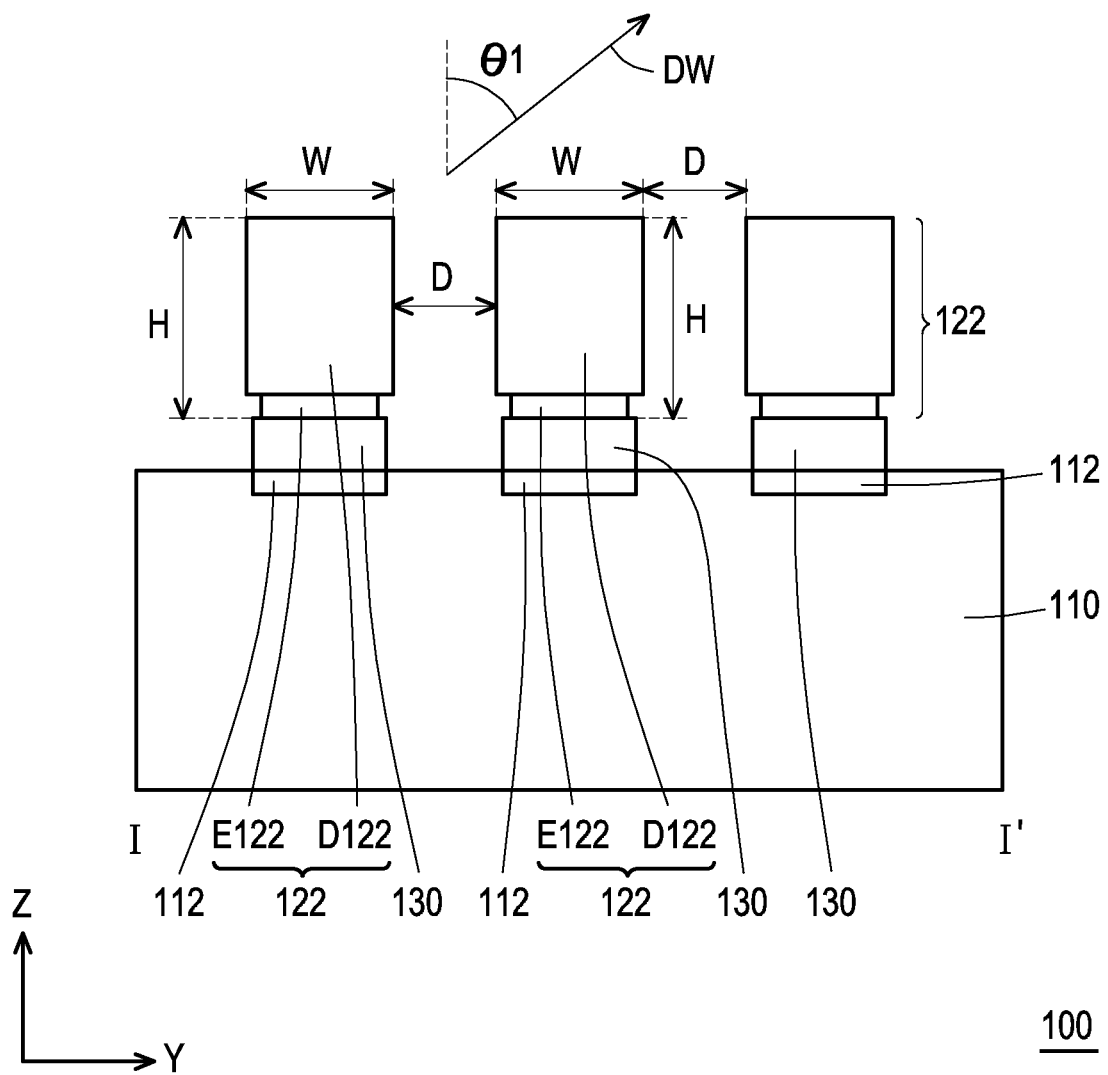
FIG. 2 is a schematic cross-sectional diagram of the light emitting device of FIG. 1 taken along a line I-I'.

FIG. 2 is a schematic cross-sectional diagram of the light emitting device of FIG. 1 taken along a line I-I'. Specifically, the cross-sectional structure presented in FIG. 2 may be applied to one or more pixels 120 in FIG. 1, or even to all the pixels 120 in the light emitting device 100. As shown in FIG. 2, in the light emitting device 100, a pixel 120 includes three sub-pixels 122, and the three sub-pixels 122 are disposed on the substrate 110. In this embodiment, the light emitting device 100 further includes a conductive bonding material 130, and a sub-pixel 122 may be coupled to the substrate 110 through the conductive bonding material 130. In this embodiment, the conductive bonding material 130 may be a conductive solder, such as an alloy solder. In other embodiments, the conductive bonding material 130 may include a wire bonding material.

The substrate 110 may be a circuit board, an active component substrate, or other plate-shaped structure that may be used to provide driving signals and/or power to the sub-pixels 122 and may support the sub-pixels 122. In some embodiments, when the substrate 110 is a circuit board, the substrate 110 may include multiple conductive circuit layers and multiple insulating layers that an insulating layer is used for separating the two adjacent conductive circuit layers, but the disclosure is not limited thereto. Specifically, the substrate 110 includes pads 112 for being electrically connected to the sub-pixels 122, and the pads 112 are located on the surface of the substrate 110 facing the sub-pixels 122. At the same time, an electrode E122 are disposed on the chip D122 of a sub-pixel 122, and the electrode E122 is located on the surface of a sub-pixel 122 facing the substrate 110, but the disclosure is not limited thereto. A sub-pixel 122 may be coupled to the corresponding pad 112 on the substrate 110 through the conductive bonding material 130. In some embodiments, the sub-pixel 122 is, for example, a light emitting diode, and the sub-pixel 122 has a pair of electrodes. However, FIG. 2 only schematically shows an example that one electrode is coupled to the substrate 110, and the other electrode coupled to the substrate 110 may have a structure similar to that shown in FIG. 2.

The sub-pixels 122 are, for example, manufactured in advance before being coupled to the substrate 110. The method of coupling the sub-pixels 122 may include, for example, placing the manufactured sub-pixels 122 (such as light emitting diodes) on the substrate 110, the conductive bonding materials 130 exist between the sub-pixels 122 and the substrate 110, and the coupling the sub-pixels 122 and the substrate 110 through a bonding step. It should be noted that, in the disclosure, the bonding step may include, for example but not limited to, welding, anisotropic conductive adhering, or eutectic bonding. In addition, there may be errors during coupling the sub-pixels 122. For example, the sub-pixels 122 may tilt during coupling, which causes that the main light emitting directions of the sub-pixels 122 are not always parallel to the normal direction of the substrate (such as a Z axis in FIG. 2) or the positions of some sub-pixels 122 may be shifted during coupling, such that the distances between two adjacent sub-pixels 122 may be different. At this time, due to the tilting of the sub-pixels 122 or the different distances D, the part of light which is emitted from a sub-pixel 122 and is blocked by the adjacent sub-pixels 122 may vary, it results in that greater luminance loss at a large angle occurs in some sub-pixels 122, or it leads to worse light emitting performance. For example, if more part of the light emitted from a blue sub-pixel 122 in one pixel 120 is blocked, when a user views the light emitting device at a large angle, the light emitting color of that pixel 120 may look reddish or greenish since more blue light is blocked. It should be noted that in the disclosure, the distance D may be defined as the minimum distance between two adjacent sub-pixels 122 measured along the arrangement direction of the sub-pixels 122 (for example, the Y axis in FIG. 2).

According to the above description, among the pixels 120, when the aforementioned light blocking occurs in the sub-pixels 122 of the same color, a color shift may happen, and the color shift becomes relatively obvious at a large angle. For example, when light blocking occurs in all the blue sub-pixels, then the light emitting color may be reddish or greenish. In addition, although the relatively small distance D may achieve higher resolution, the light emitting performance may not be ideal. However, the larger the distance D, the smaller the resolution that may be provided. Therefore, the distance D may affect the light emitting performance of the light emitting device 100.

A sub-pixel 122 has a height, and the height of the sub-pixel 122 may be, for example, the minimum distance between the surface of the chip D122 away from the substrate 110 and the surface of the electrode E122 facing the substrate 110. The larger the height, the more obvious the situation of blocking other adjacent sub-pixels 122 may be. In order to balance the resolution and display quality, in this embodiment, the distance between two adjacent sub-pixels 122 and the height of the two adjacent sub-pixels 122 in the pixel 120, for example, satisfy a relational expression: $0.3H<D\leq30H$, where D is the distance between two adjacent sub-pixels 122 and H is the height of at least one sub-pixel 122. If the heights of the two adjacent sub-pixels 122 are different, then the height H is defined as the height of the higher sub-pixel 122. D and H are expressed in the same unit, such as cm, mm, μm, or other length units. In some embodiments, the distance D and the height H, for example, satisfy a relational expression: $0.3H<D\leq3H$. In some embodiments, D may be 0.6H, 0.8H, 0.9H, 1.2H, 2H, 2.5H, or the like. In some embodiments, the distance D that is greater than 0.3 times of the height H (i.e., $0.3H<D$) may reduce that the light emitted from a sub-pixel 122 is blocked by an adjacent sub-pixel 122 at a large viewing angle θ1. The viewing angle θ1 may be an intersection angle between a viewing direction DW and the normal direction of the substrate (such as the Z axis in FIG. 2), and the viewing angle θ1 is, for example, greater than or equal to 30 degrees (i.e., $\theta1\geq30°$). Therefore, the color shift of the light emitting device 100 at a large angle may be reduced, and a good light emitting performance may be provided.

Hereinafter, in conjunction with FIG. 1, two adjacent pixels 120, namely a first pixel 120A and a second pixel 120B, are used to illustrate the layout of these pixels 120, but the disclosure is not limited thereto. Both the first pixel 120A and the second pixel 120B are disposed on the substrate 110, and the first pixel 120A and the second pixel 120B are disposed adjacent to each other. For example, the first pixel 120A and the second pixel 120B are disposed adjacent to each other in the direction of the X axis, and the first pixel 120A and the second pixel 120B respectively include multiple sub-pixels 122. In this embodiment, a sub-pixel 122 may have a rectangular profile, and the sub-pixel 122 is oriented to have a width in a first direction R1 smaller than a length in a second direction R2, but the disclosure is not limited thereto. In this embodiment, the first direction R1 may be parallel to the Y axis and be a direction from a first side 110S1 of the substrate 110 to a second side 110S2 of the substrate 110, and the second direction R2 may be parallel to the X axis and be a direction from a third side 110S3 of the substrate 110 to a fourth side 110S4 of the substrate 110, but the disclosure is not limited thereto. In some embodiments, the first direction R1 and the second direction R2 may respectively be parallel to the X axis direction and the Y axis direction. In some embodiments, the sub-pixel 122 may have a square profile, a circular profile, and a profile in other geometric shapes.

The amounts of the sub-pixels 122 included in the first pixel 120A and the second pixel 120B are the same. For example, the first pixel 120A includes three sub-pixels 120, and the second pixel 120B also includes three sub-pixels 120. In some embodiments, the three sub-pixels 120 of the first pixel 120A have different light emitting colors, and the three sub-pixels 120 of the second pixel 120B also have different light emitting colors. In this embodiment, the three sub-pixels 120 of the first pixel 120A may be a first color sub-pixel 122A, a second color sub-pixel 122B, and a third color sub-pixel 122C, and the three sub-pixels 120 of the second pixel 120B may be the first color sub-pixel 122A, the second color sub-pixel 122B, and the third color sub-pixel 122C. In some embodiments, the first sub-pixel 122A, the second sub-pixel 122B, and the third sub-pixel 122C have different light emitting colors, such as being a red sub-pixel, a blue sub-pixel, and a green sub-pixel, but the disclosure is not limited thereto. In other embodiments, the light emitting colors of the sub-pixels 122 may include red, green, blue, yellow, cyan, and other colors. In some embodiments, the sub-pixel 122 may include a light emitting component (such as a light emitting diode), and the light emitting color of the sub-pixel 122 may be determined by the light emitting component. In other embodiments, in addition to the light emitting component, the sub-pixel 122 may further include a light conversion component (such as a quantum dot layer) and/or a color filter component, and the light emitting color of the sub-pixel 122 is determined by one or more of the light emitting component, the light conversion component, and the color filter component. In some embodiments, all the pixels 120 of the light emitting device 100 may have the same amount of the sub-pixels 122, but the disclosure is not limited thereto.

In FIG. 1, multiple sub-pixels in all pixels are arranged along the first direction, for example, the first color sub-pixel 122A, the second color sub-pixel 122B, and the third color sub-pixel 122C of the first pixel 120A are arranged in a sequence along the first direction R1. In other words, in the first pixel 120A, the second color sub-pixel 122B is located between the first color sub-pixel 122A and the third color sub-pixel 122C. The first color sub-pixel 122A is adjacent to the first side 110S1 of the substrate 110, and the third color sub-pixel 122C is adjacent to the second side 110S2 of the substrate 110, wherein the first side 110S1 and the second side 110S2 are opposite to each other. In addition, the third color sub-pixel 122C, the second color sub-pixel 122B, and the first color sub-pixel 122A of the second pixel 120B are arranged in a sequence along the first direction R1. In other words, in the second pixel 120B, the second color sub-pixel 122B is located between the first color sub-pixel 122A and the third color sub-pixel 122C. The third color sub-pixel 122C is adjacent to the first side 110S1 of the substrate 110, and the first color sub-pixel 122A is adjacent to the second side 110S2 of the substrate 110.

Therefore, in FIG. 1, multiple sub-pixels 122 of the first pixel 120A are arranged in a first color sequence along the first direction R1, and multiple sub-pixels 122 of the second pixel 120B are arranged in a second color sequence along the first direction R1, and the first color sequence is different from the second color sequence. A color sequence refers to an order of light emitting colors of the sequentially arranged sub-pixels 122. For example, the first color sequence is red-green-blue, and the second color sequence is blue-green-red. In this way, the light emitting device 100 is less prone to a color shift of the emitted light at a large angle. For example, when the light emitting device 100 is viewed at a large angle near the first side 110S1, the first color sub-pixel 122A of the first pixel 120A is closer to a viewer, while the third color sub-pixel 122C is farther from the viewer. At the same time, the third color sub-pixel 122C of the second pixel 120B is closer to the viewer, while the first color sub-pixel 122A is farther from the viewer. Assuming that the aforementioned light blocking occurs in the sub-pixels 122 farther from the viewer at a large angle, then more part of the light emitted from the third color sub-pixel 122C is blocked in the first pixel 120A, and more part of the light emitted from the first color sub-pixel 122A is blocked in the second pixel 120B. In this way, the overall light emitting color of the light emitting device 100 is not easily shifted toward the color of the first color sub-pixel 122A, nor is it easily shifted toward the color of the third color sub-pixel 122C. In other words, the potential color shift of the light emitting device 100 may be reduced.

In this embodiment, when three sub-pixels 122 in one single pixel 120 are respectively a red sub-pixel, a green sub-pixel, and a blue sub-pixel, then the sub-pixels may be arranged by selecting, for example, one of the following color sequences: red-green-blue, blue-green-red, red-blue-green, green-blue-red, green-red-blue, and blue-red-green, and are not limited to the color sequence shown in FIG. 1. In some embodiments, any two of the above color sequences may be selected to implement the arrangement of sub-pixels in two adjacent ones among multiple pixels 120, which helps reduce or improve the color shift of the light emitting device 100. Therefore, the light emitting device 100 may provide a good light emitting performance. In some embodiments, in addition to adopting different color sequences to implement the arrangement of the sub-pixels in the adjacent pixels 120, adjusting a drive control signal may further reduce or improve the color shift of the light emitting device 100. For example, after the manufacturing of the light emitting device 100 is completed, the light emitting performance of the light emitting device 100 may be detected. If a color shift is detected at a large angle, a suitable algorithm may be used to estimate the extent to which the light emitting intensity of the individual sub-pixel 122 should be adjusted, such that the adjusted drive control signal is used to improve the color shift. The drive control signal may be completed in the calibration procedure before a product leaves the factory, but the disclosure is not limited thereto.

In some embodiments, the pixels 120 of the light emitting device 100 may be divided into different pixel groups according to the sub-pixel arrangement. For example, in FIG. 1, the pixels 120 of the light emitting device 100 may be divided to include a first pixel group G1 and an adjacent second pixel group G2, with the first pixel group G1 and the second pixel group G2 arranged in two adjacent columns in the Y axis direction, but the disclosure is not limited thereto. A same color sequence may be used to arrange the sub-pixels 122 in each pixel 120 in the first pixel group G1, such as arranging the sub-pixels in the first color sequence (red-green-blue arranged along the first direction R1), which is the same as the first pixel 120A. At the same time, another color sequence may be used to arrange the sub-pixels 122 in each pixel 120 in the second pixel group G2, such as arranging the sub-pixels in the second color sequence (blue-green-red arranged along the first direction R1), which is the same as the second pixel 120B. In other words, pixels in adjacent pixel groups arrange sub-pixels in different color sequences, but pixels in the same pixel group arrange sub-pixels in the same color sequence. However, the layout and arrangement of the pixels 120 shown in FIG. 1 is merely exemplary. In other embodiments, a pixel group may be composed of the pixels 120 arranged in the same row in the X axis direction. In addition, pixels in a pixel group are not limited to being arranged in the same line. In some embodiments, a pixel group may include 2, 4, 6, 9, 16, or other amounts of pixels 120, and the pixels in a pixel group may be arranged in a row, arranged in a column, arranged into an array, arranged to form a triangle, or arranged in other ways.

Figure 3:
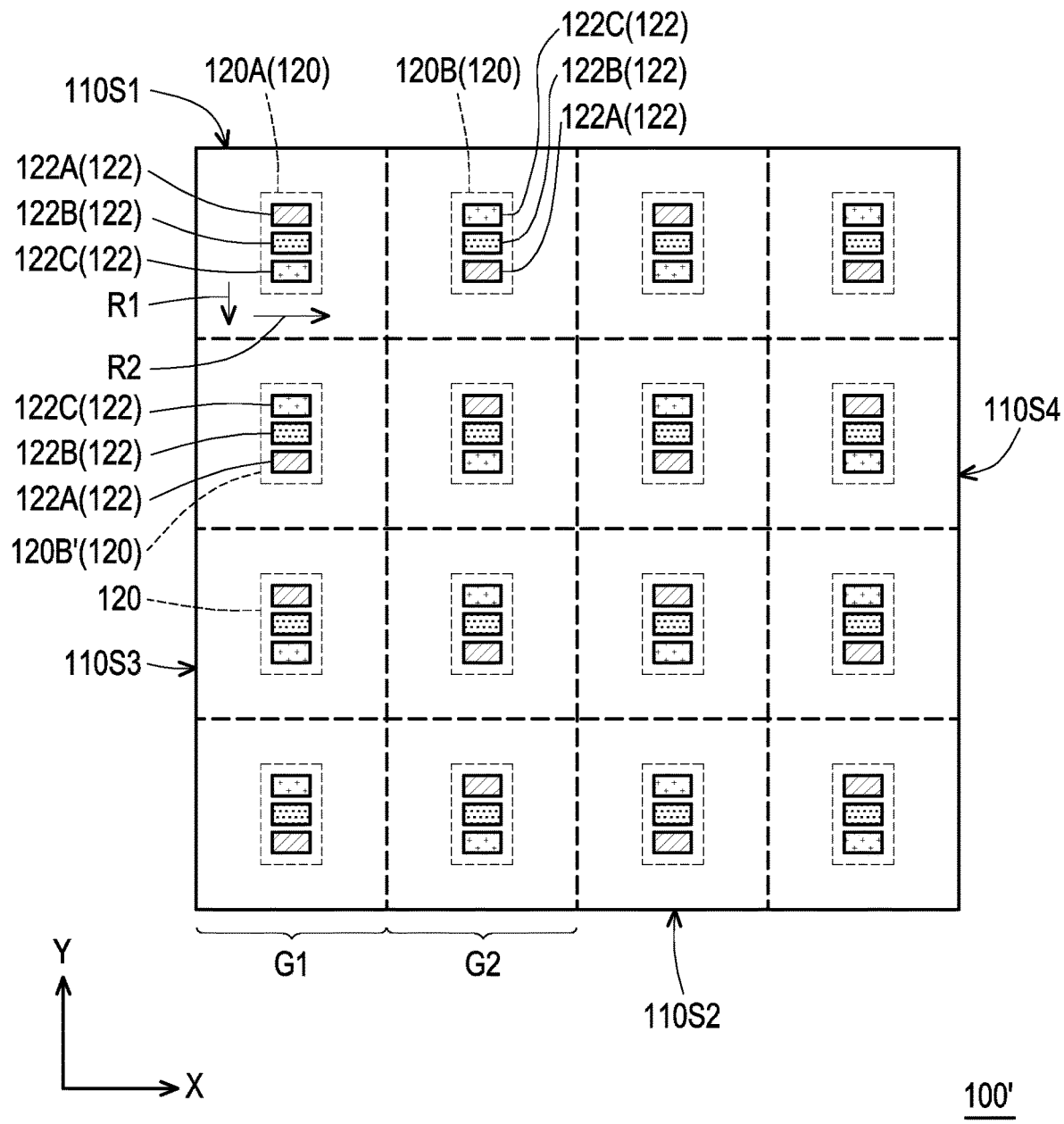
FIG. 3 is a schematic diagram of a light emitting device according to an embodiment of the disclosure.

FIG. 3 is a schematic diagram of a light emitting device according to an embodiment of the disclosure. A light emitting device 100' of FIG. 3 is similar to the light emitting device 100 of FIG. 1. In the light emitting device 100' of FIG. 3, the first pixel 120A and the second pixel 120B adjacent in the X axis direction have the sub-pixels 122 arranged in different color sequences. At the same time, the first pixel 120A and a third pixel 120B' adjacent in the Y axis direction also have the sub-pixels 122 arranged in different color sequences. Specifically, in the light emitting device 100' of FIG. 3, the designs of the first pixel 120A and the second pixel 120B are respectively the same as those described in FIG. 1, while the three sub-pixels 122 of the third pixel 120B' adjacent to the first pixel 120A have a different arrangement sequence of light emitting colors.

For example, in the first pixel 120A, the first color sub-pixel 122A, the second color sub-pixel 122B, and the third color sub-pixel 122C are arranged in a sequence along the first direction R1, and in the second pixel 120B', the third color sub-pixel 122C, the second color sub-pixel 122B, and the first color sub-pixel 122A are arranged in a sequence along the first direction R1. In this way, the color sequence of the first pixel 120A is different from that of the second pixel 120B adjacent in the X axis and that of the third pixel 120B' adjacent in the Y axis. In addition, it is exemplary that the color sequence of the second pixel 120B is the same as that of the third pixel 120B' in this embodiment, but the disclosure is not limited thereto. In other embodiments, the color sequences of the second pixel 120B and the third pixel 120B' may be different. For example, the sub-pixels of a pixel 120 may be arranged by selecting one of the following color sequences: red-green-blue, blue-green-red, red-blue-green, green-blue-red, green-red-blue, and blue-red-green.

Figure 4:
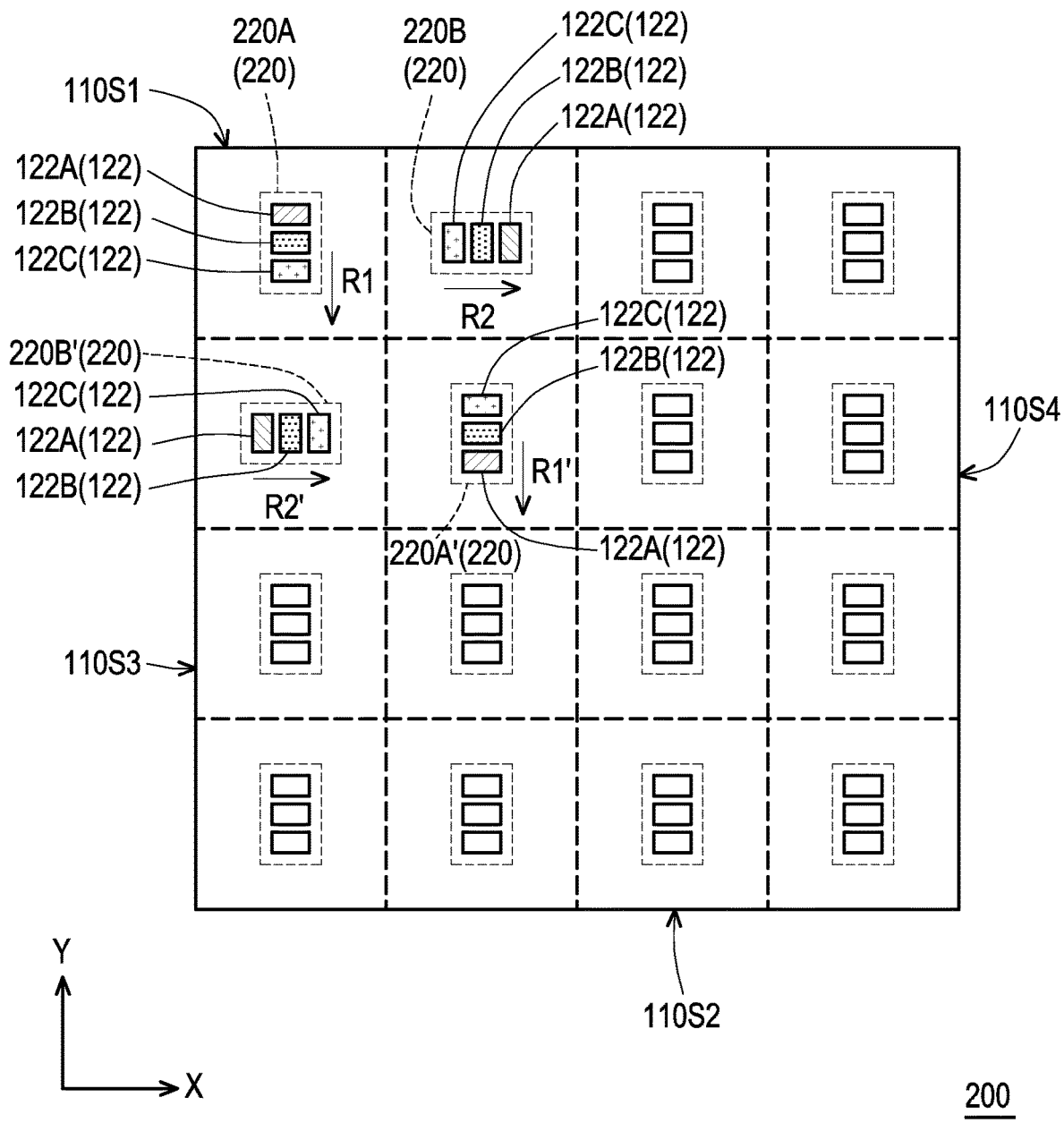
FIG. 4 is a schematic diagram of a light emitting device according to an embodiment of the disclosure.

FIG. 4 is a schematic diagram of a light emitting device according to an embodiment of the disclosure. A light emitting device 200 in FIG. 4 includes the substrate 110 and multiple pixels 220. A pixel 220 includes multiple sub-pixels 122, and the sub-pixels 122 may respectively be the first color sub-pixel 122A, the second color sub-pixel 122B, and the third color sub-pixel 122C according to light emitting colors, but the disclosure is not limited thereto. The structure and relevant configuration of the substrate 110, the sub-pixels 122, the first color sub-pixel 122A, the second color sub-pixel 122B, and the third color sub-pixel 122C in FIG. 4 may be referred to FIG. 1 and FIG. 2. The difference between the embodiment in FIG. 4 and the embodiment in FIG. 1 will be described as follows. However, the disclosure does not exclude adding the features of FIG. 1, FIG. 2, and/or FIG. 3 to the embodiment of FIG. 4.

In this embodiment, as shown in FIG. 4, the three sub-pixels 122 in a first pixel 220A are the first color sub-pixel 122A, the second color sub-pixel 122B, and the third color sub-pixel 122C, with the first color sub-pixel 122A and the second color sub-pixel 122B, and the third color sub-pixel 122C arranged in a sequence along the first direction R1. In this embodiment, the first direction R1 may be parallel to the Y axis and be a direction from the first side 110S1 of the substrate 110 to the second side 110S2 of the substrate 110, but the disclosure is not limited thereto.

A second pixel 220B adjacent to the first pixel 220A in the X axis direction includes the first color sub-pixel 122A, the second color sub-pixel 122B, and the third color sub-pixel 122C. The third color sub-pixel 122C, the second color sub-pixel 122B, and the first color sub-pixel 122A of the second pixel 220B are arranged in order along the second direction R2. In this embodiment, the second direction R2 is different from the first direction R1. For example, the second direction R2 may be parallel to the X axis and be a direction from the third side 110S3 of the substrate 110 to the fourth side 110S4 of the substrate 110, but the disclosure is not limited thereto. Herein, the first direction R1 and the second direction R2 are respectively parallel to the Y axis and the X axis, but the disclosure is not limited thereto. In some embodiments, the first direction R1 and the second direction R2 are two different directions. For example, an intersection angle between the first direction R1 and the second direction R2 may be from greater than 0 degrees to less than 180 degrees (0 degrees<intersection angle<180 degrees), such as 60 degrees, 90 degrees, 120 degrees, or the like, but the disclosure is not limited thereto. It should be noted that the intersection angle between the first direction R1 and the second direction R2 may be defined as an angle measured counterclockwise from a first imaginary line extending along the first direction R1 to a second imaginary line extending along the second direction R2 when the first imaginary line and the second imaginary line intersect each other.

In addition, the pixel 220 adjacent to the first pixel 220A in the Y axis direction is referred to herein as a third pixel 220B'. The first color sub-pixel 122A, the second color sub-pixel 122B, and the third color sub-pixel 122C included in the third pixel 220B' may be arranged in a sequence along a third direction R2'. Herein, the third direction R2' is different from the first direction R1, and the third direction R2' may be parallel to the second direction R2, but the disclosure is not limited thereto. For example, the third direction R2' of this embodiment is parallel to the X axis direction and is a direction from the third side 110S3 of the substrate 110 to the fourth side 110S4 of the substrate 110, but the disclosure is not limited thereto. In some embodiments, the third direction R2' of this embodiment may also be different from both the first direction R1 and the second direction R2. As shown in FIG. 4, in this embodiment, the first sub-pixel 122A, the second sub-pixel 122B, and the third sub-pixel 122C of the third pixel 220B' are arranged in a color sequence different from that of the second pixel 220B along the third direction R2'. However, the disclosure is not limited thereto. In some embodiments, the second pixel 220B and the third pixel 220B' may respectively have the sub-pixels arranged in the same color sequence.

The pixel 220 adjacent to the third pixel 220B' in the X axis direction may be referred to as a fourth pixel 220A'. The fourth pixel 220A' may include three sub-pixels 122, such as the first color sub-pixel 122A, the second color sub-pixel 122B, and the third color sub-pixel 122C. In the fourth pixel 220A', the third color sub-pixel 122C, the second color sub-pixel 122B, and the first color sub-pixel 122A are arranged in a sequence along a fourth direction R1'. Herein, the fourth direction R1' is different from both the second direction R2 and the third direction R2', and the fourth direction R1' may be parallel to the first direction R1. For example, the fourth direction R1' may be parallel to the Y axis direction and be a direction from the first side 110S1 of the substrate 110 to the second side 110S2 of the substrate 110, but the disclosure is not limited thereto. In some embodiments, the fourth direction R1' may be different from the first direction R1, the second direction R2, and the third direction R2'. In this embodiment, the sub-pixels 122 of the first pixel 220A and the sub-pixels 122 of the fourth pixel 220A' may be arranged in different color sequences. However, in some embodiments, the fourth pixel 220A' may have the same color sequence for arrangement as the first pixel 220A does.

In this embodiment, the first pixel 220A and the second pixel 220B adjacent in the X axis direction have sub-pixels arranged in different color sequences, as well as the third pixel 220B' and the fourth pixel 220A' adjacent in the X axis direction have sub-pixels arranged in different color sequences. In addition, the first pixel 220A and the third pixel 220B' adjacent in the Y axis direction have sub-pixels arranged in different color sequences, as well as the second pixel 220B and the fourth pixel 220A' adjacent in the Y axis direction also have sub-pixels arranged in different color sequences. This helps reduce the color shift problem caused by adopting one single sub-pixel arrangement direction and/or one color sequence in a light emitting device 200. Therefore, the light emitting device 200 may provide a good light emitting performance. In some embodiments, the first pixel 220A and the fourth pixel 220A' may have sub-pixels arranged in the same color sequence or different color sequences. Similarly, the second pixel 220B and the third pixel 220B' may have sub-pixels arranged in the same color sequence or different color sequences.

In other embodiments, the pixels 220 may be divided into multiple pixel groups. A pixel group may include multiple adjacent pixels 220, and a pixel 220 in one of two adjacent pixel groups may have the arrangement of the sub-pixels 122 by selecting the sub-pixel arrangement of one of the first pixel 220A and the fourth pixel 220A', while a pixel 220 in the other pixel group may have the arrangement of the sub-pixels 122 by selecting the sub-pixel arrangement of one of the second pixel 220B and the third pixel 220B', but the disclosure is not limited thereto. In some embodiments, multiple pixels 220 in the light emitting device 200 may have two or more sub-pixel arrangements. Therefore, there may be an aspect where two adjacent pixels 220 belong to the same pixel group have the same sub-pixel arrangement but another two adjacent pixels 220 belong to different pixel groups have different sub-pixel arrangements. In other words, the disclosure does not limit all the pixels 220 to having color sequences different from those of their adjacent pixels 220.

Figure 5:
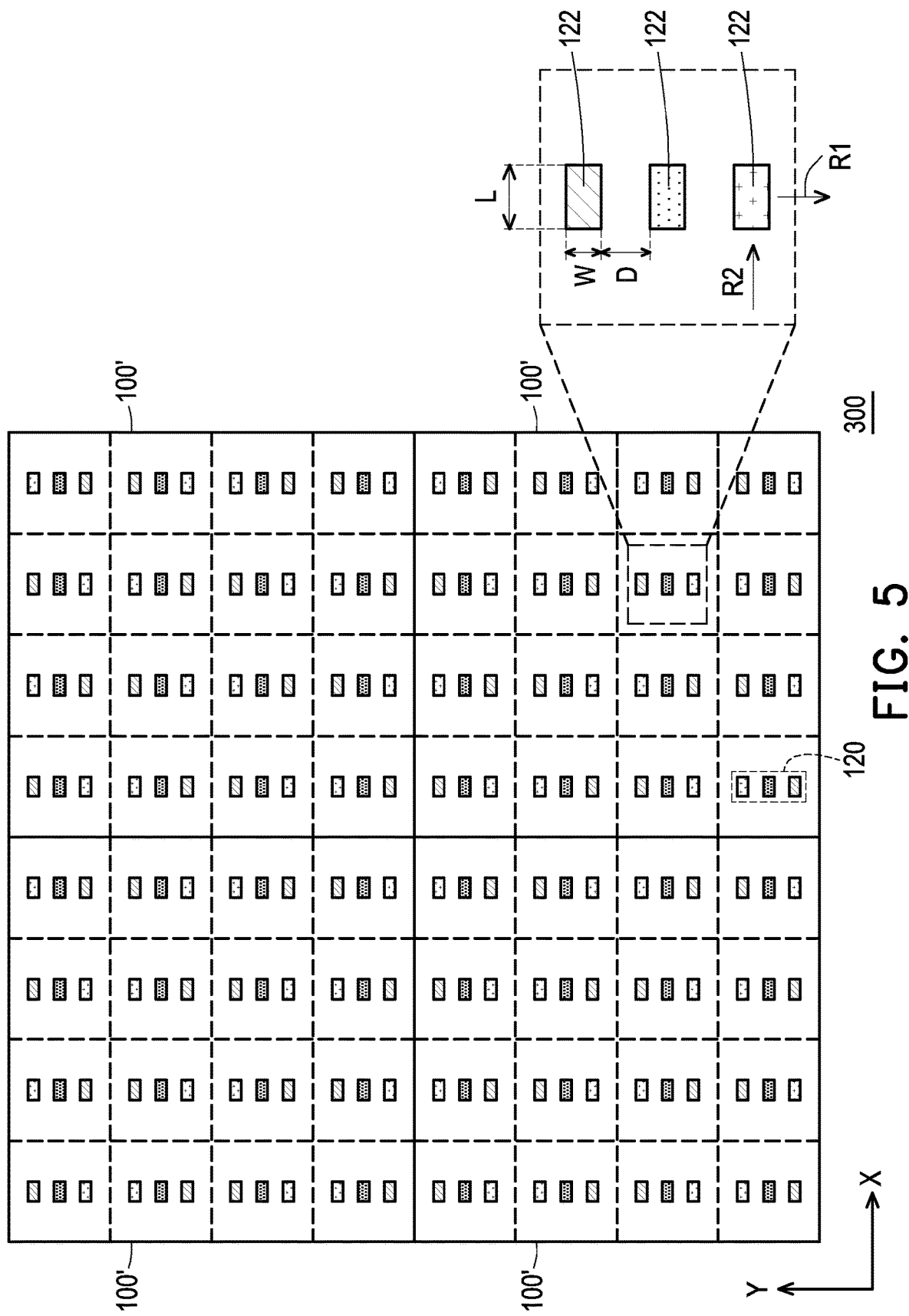
FIG. 5 is a schematic diagram of an electronic device according to an embodiment of the disclosure.

FIG. 5 is a schematic diagram of an electronic device according to an embodiment of the disclosure. In FIG. 5, multiple light emitting devices 100' are tiled together to form an electronic device 300. A light emitting device 100' includes multiple pixels 120, and a pixel 120 includes multiple sub-pixels 122. Since the structure and configuration of the light emitting device 100' mat be referred to the embodiment in FIG. 3, and details are not repeated in this embodiment. Two adjacent pixels 120 in a light emitting device 100' may have different sub-pixel arrangements, and the sub-pixels 122 in the electronic device 300 may be arranged as the sub-pixel arrangement shown in FIG. 3, but the disclosure is not limited thereto. For example, in some embodiments, the sub-pixels 122 in the electronic device 300 may optionally adopt the sub-pixel arrangement shown in FIG. 1 or FIG. 4.

In this embodiment, a sub-pixel 122 has, for example, a rectangular shape. Among the sub-pixels 122, at least one of the two adjacent sub-pixels 122 has a width W in the sub-pixel arrangement direction (exemplified by the first direction R1 parallel to the Y axis in FIG. 5) and has a length L in another direction vertical to the sub-pixel arrangement direction (exemplified by the second direction R2 parallel to the X axis in FIG. 5), with the length L greater than the width W, but the disclosure is not limited thereto. It should be noted that the width of the sub-pixel 122 may be defined as the maximum width obtained by measuring the profile of the sub-pixel 122 in the sub-pixel arrangement direction (such as the first direction R1). If the two adjacent sub-pixels have different widths, then the larger one is defined as the width W. The length L may be defined as the maximum length obtained by measuring a sub-pixel 122 in a length measurement direction (such as the second direction R2). In addition, in the same pixel 120, the width W in two adjacent sub-pixels and the distance D between the two adjacent sub-pixels 122 may be in a relation where D is between 0.3W and 1.5W (0.3W≤D≤1.5W), with the distance D and the width W measured in the same direction (such as the first direction R1 parallel to the Y axis), but the disclosure is not limited thereto. For example, in some embodiments, D may be 0.5W, 0.8W, 1.2W, or the like. In some embodiments, the sub-pixel 122 includes a light emitting component, such as a light emitting diode. In some embodiments, the sub-pixel 122 includes a light emitting component and a package material encapsulating the light emitting component, and the width W and the length L are referred to the size obtained by measuring the profile of the light emitting component. When multiple light emitting devices 100' are tiled together to form the electronic device 300, the design with D between 0.3W and 1.5W helps provide a good light emitting performance. In other embodiments, the extension direction of the length L of the sub-pixel 122 may be parallel to the Y axis direction, or the extension direction of the length L may be different from both the X axis and the Y axis.

In summary, the light emitting device in the embodiments of the disclosure includes multiple pixels. Among multiple sub-pixels of a pixel, the distance between two adjacent sub-pixels is greater than 0.3 times of the height of one of the two adjacent sub-pixels. In this way, the light emitted from the sub-pixels is not prone to being blocked by the adjacent sub-pixels at a large angle, or it helps reduce or improve the potential color shift problem of the light emitting device. In addition, the pixels adjacent may have sub-pixel arrangements in different color sequences or have different sub-pixel arrangement directions. In this way, if a color shift occurs in a pixel at a large angle, because the adjacent pixels may have different sub-pixels arrangement direction or have sub-pixels arranged in a different color sequences, the adjacent pixels may have different color shifts (i.e., the light emitting color shifts to a different color) in the same large angle, which helps improve the overall light emitting color of the light emitting device. Therefore, the light emitting device may have a good light emitting performance and is not prone to an obvious color shift. For example, if a reddish color shift occurs in a pixel at a large angle, pixels adjacent thereto may have a bluish color shift at the same angle, so the overall light emitted from the light emitting device may not have an obvious reddish or bluish color shift.

Finally, it should be noted that: the above embodiments are only used to illustrate technical solutions of the disclosure and are not intended to limit the disclosure. Although the disclosure has been described in detail with reference to the above embodiments, people of ordinary skill in the art should understand that they may still modify the technical solutions described in the above embodiments, replace or combine some or all of the technical features therein with equivalents, and such modifications, replacements or combination of corresponding technical solutions do not substantially deviate from the scope of the technical solutions of the embodiments of the disclosure.

What is claimed is:

1. A light emitting device, comprising:
a substrate; and
a plurality of pixels, disposed on the substrate, wherein each of the pixels comprises a plurality of sub-pixels, two adjacent ones of the sub-pixels are separated by a distance D, and one of the two adjacent ones of the sub-pixels has a height H, a length, and a width, wherein the distance and the height satisfy a relational expression: 0.3H<D≤30H, and the length is greater than the width,
wherein the width is measured in a first direction which is parallel to an arrangement direction of the two adjacent ones of the sub-pixels, and the length is measured in a second direction which is vertical to the arrangement direction of the two adjacent ones of the sub-pixels,
wherein a first one of the pixels has a plurality of sub-pixels arranged along the first direction in a first color sequence, a second one of the pixels has a plurality of sub-pixels arranged along the second direction in a second color sequence, wherein the first one of the pixels is adjacent to the second one of the pixels, the first direction is different from the second direction, and the first color sequence is different from the second color sequence.

2. The light emitting device according to claim 1, wherein each of the pixels has a same amount of the sub-pixels.

3. The light emitting device according to claim 1, wherein the sub-pixels of each of the pixels are a first color sub-pixel, a second color sub-pixel, and a third color sub-pixel, and the first color sub-pixel, the second color sub-pixel, and the third color sub-pixel have different light emitting colors.

4. The light emitting device according to claim 3, wherein the first color sub-pixel, the second color sub-pixel, and the third color sub-pixel of the first one of the pixels are arranged in the first color sequence, and the first color sub-pixel, the second color sub-pixel, and the third color sub-pixel of the second one of the pixels are arranged in the second color sequence.

5. The light emitting device according to claim 3, wherein the light emitting color of one of the first color sub-pixel, the second color sub-pixel, and the third color sub-pixel is selected from a group consisting of red, green, blue, yellow, and cyan.

6. The light emitting device according to claim 1, wherein the width of one of the two adjacent ones of the sub-pixels is W, and the distance D is between 0.3W and 1.5W.

7. The light emitting device according to claim 1, further comprising a conductive bonding material, wherein one of the sub-pixels is coupled to the substrate through the conductive bonding material.

8. The light emitting device according to claim 1, wherein one of the sub-pixels comprises a light emitting chip.

9. The light emitting device according to claim 8, wherein the one of the sub-pixels comprises a package material for encapsulating the light emitting chip.

10. The light emitting device according to claim 1, wherein the substrate comprises a circuit board or an active component substrate.

11. The light emitting device according to claim 1, wherein the first pixel group and the second pixel group are arranged in two adjacent columns.

* * * * *